(12) United States Patent
Sun et al.

(10) Patent No.: US 8,231,736 B2
(45) Date of Patent: Jul. 31, 2012

(54) WET CLEAN PROCESS FOR RECOVERY OF ANODIZED CHAMBER PARTS

(75) Inventors: Jennifer Y. Sun, Sunnyvale, CA (US); Senh Thach, Union City, CA (US); Xi Zhu, San Jose, CA (US); Li Xu, San Jose, CA (US); Anisul Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 703 days.

(21) Appl. No.: 11/845,620

(22) Filed: Aug. 27, 2007

(65) Prior Publication Data

US 2009/0056745 A1     Mar. 5, 2009

(51) Int. Cl.
*B08B 3/00* (2006.01)
(52) U.S. Cl. .................................. 134/26; 134/2; 134/3
(58) Field of Classification Search .................. 134/1.3, 134/2, 3, 22.1, 26, 41, 42; 438/905
See application file for complete search history.

(56) References Cited

U.S. PATENT DOCUMENTS

| 2,431,595 | A | * | 11/1947 | White ................................ 134/2 |
| 3,016,293 | A | * | 1/1962 | Cybriwsky et al. ................ 8/485 |
| 3,652,429 | A |   | 3/1972 | Deltombe et al. |
| 3,961,111 | A | * | 6/1976 | Smith ........................ 427/419.2 |
| 5,538,600 | A | * | 7/1996 | Schultz et al. .................... 428/31 |
| 5,972,123 | A | * | 10/1999 | Verhaverbeke ................... 134/3 |
| 6,140,243 | A |   | 10/2000 | Wallace et al. |
| 6,450,117 | B1 | * | 9/2002 | Murugesh et al. ..... 118/723 ME |
| 6,811,615 | B2 | * | 11/2004 | Sun .................................... 134/1 |
| 6,841,008 | B1 | * | 1/2005 | Branco et al. .................... 134/26 |
| 7,150,796 | B2 | * | 12/2006 | Smith et al. ...................... 134/18 |
| 2003/0190870 | A1 |   | 10/2003 | Shih et al. |
| 2004/0151926 | A1 | * | 8/2004 | Wada et al. ................... 428/472 |
| 2004/0159401 | A1 | * | 8/2004 | Miya et al. ............... 156/345.24 |
| 2004/0221869 | A1 | * | 11/2004 | Smith et al. ..................... 134/1.1 |
| 2006/0000492 | A1 |   | 1/2006 | Carter |

FOREIGN PATENT DOCUMENTS

| EP | 0851474 A2 | 7/1998 |
| WO | WO 99/60083 A1 | 11/1999 |
| WO | WO 0215255 A1 * | 2/2002 |

OTHER PUBLICATIONS

Advantages of Using Hot DI Water—Process Technology. Archived using the "Wayback Machine". 2002. http://web.archive.org/web/20021113045104/http://www.process-technology.com/processtechnol/hotdi.htm.*
ChemFinder. p. 2/3.*
European search report, EP 08162492.6. Apr. 15, 2011.

* cited by examiner

*Primary Examiner* — Michael Kornakov
*Assistant Examiner* — Nicole Blan
(74) *Attorney, Agent, or Firm* — Charles S. Guenzer

(57) ABSTRACT

A cleaning process for recovering an anodized aluminum part is particularly useful when the part has been exposed to a fluorine-containing plasma in etch reactor. The part is bathed in an agitated solution of a fluoride acid, such as ammonium fluoride, which converts aluminum fluoride to a soluble fluoride. The part is rinsed in water. The pores of the cleaned anodization may be resealed by a submerging the part in hot agitated deionized water.

16 Claims, 4 Drawing Sheets

WET CLEAN PROCESS FOR RECOVERY OF ANODIZED CHAMBER PARTS

FIELD OF THE INVENTION

The invention relates generally to plasma processing equipment. In particular, the invention relates to the cleaning of chamber parts used in a plasma etch reactor.

BACKGROUND ART

Plasma reactors are used for a number of steps in the fabrication of semiconductor integrated circuits including plasma enhance chemical vapor deposition (PECVD), magnetron sputtering or more generally physical vapor deposition (PVD), etching, and cleaning as well as other general plasma processing for conditioning or treating one or more layers of the circuits being developed on a wafer. Modern plasma processing equipment tends to be very expensive because it needs to perform within a wide narrow processing window and be capable of operating with little down time for repair and maintenance. Thus, it is desired to widen the processing window and reduce down time without significant increasing the cost.

One problem in the operation of plasma reactors is that material tends to deposit on the parts of the chamber other than the wafer being processed. Deposition can occur not only in deposition chambers such as used for PECVD and PVD, but also in plasma etch and cleaning reactors in which the etching process removes material from the wafer but deposits etchant residues on the chamber walls and other chamber parts. An example of a plasma etch reactor is the DPS etch reactor 10 available from Applied Materials, Inc. of Santa Clara, California and schematically illustrated in the cross-sectional view of FIG. 1. It includes a chamber body 12 and chamber lid 14 defining a processing chamber 16 and pumping chamber 18 enclosing a cathode 20 on top of which an electrostatic chuck 22 or other wafer holding device supports a wafer 24 to be etched. An edge ring 25 surrounds the wafer 24 during processing.

The wafer 24 is inserted into the processing chamber 16 through a wafer port 26 selectively closed by a slit valve door 28, also illustrated in the orthographic view of FIG. 2, to allow a vacuum pump 30 to pump the pumping chamber 18 and processing chamber 16 to a pressure typically in the mid-milliTorr range. Processing gas is metered into a gas line 32 from a gas supply 33 and injected into the processing chamber through a gas nozzle 34 on the bottom of the lid 14. A heater 36 selectively heats the lid 14 and hence the wafer 24. An RF coil 38 on the back of the lid 14 inductively couples RF power into the processing chamber 16 to excite the processing gas into a plasma to etch the wafer 24. The cathode 20 may be RF biased through a capacitive coupling circuit to assist in the etching process especially in the formation of high aspect-ratio holes. A screen 40, also illustrated in the orthographic view of FIG. 3, separates the processing and pumping chambers 16, 18 while allowing gas flow between them. It is electrically grounded to confine the plasma to the processing chamber 16.

The etching process tends to produce etch residues which deposits around the sidewalls of the processing and pumping chambers 16, 18, which require periodic cleaning. Furthermore, it is desired that the chamber body 12 be made of an inexpensive metal like aluminum while more etch-resistant and expensive materials line the processing and pumping chambers 16, 18. Accordingly, a lower liner 42, also illustrated in the orthographic view of FIG. 4, lines the pumping chamber 18 and an upper liner 44, also illustrated in the orthographic view of FIG. 5, lines the sides of processing chamber 16 and also defines part of the top of the pumping chamber 18. Similarly, a cathode liner 46, also illustrated in the orthographic view of FIG. 6, lines the lateral sides of the cathode 46.

After extended usage, which likely produces a surface coating of fluoride residue, the liners 42, 44, 46 as well as the slit valve door 28 and screen 40 may be removed from the reactor 10 to be replaced by fresh parts. Advantageously, used parts are cleaned and returned to service.

Liners and other removable parts of the chamber are often composed of aluminum. Particularly, in a metal etch reactor, aluminum itself is to some degree subject to the same etching chemistry to which the metal parts of the wafer are exposed. Even in silicon and dielectric etch chambers, the chemistry for etching the silicon or dielectric layer tends to also etch aluminum chamber parts. Accordingly, it is conventional in many plasma etch reactors to anodize aluminum chambers bodies and chamber parts to create a surface layer of anodized aluminum, generally of the composition $Al_2O_3$, which is often substantially non-reactive with metal etching plasmas. Type-III hard anodization is typically performed using a hot $H_2SO_4$ electrolyte to produce a thick, hard, black surface layer. As illustrated in the cross-sectional view of FIG. 7, anodization oxidizes an underlying aluminum part 60 acting as a substrate. It is understood that aluminum may contain up to about 10 wt % of unintentional impurities or intended alloying components such as silicon. The anodization initially creates a thin fairly uniform and dense interfacial layer 62 of anodized aluminum. However, further anodization produces a thicker columnar region 64 of anodized aluminum in which columns 66 form around pores 68. The electrolyte can fill the pores 68 to efficiently grow thick anodized layers. The pores 68 allow the columns 66 to grow upwardly relatively far away from the aluminum source material.

The solid portions 62, 64 of the anodized aluminum provide a relatively robust protective layer for the underlying aluminum part 60. However, the pores 68 provide a passageway for the etching plasma to reach close to the aluminum part 60. Accordingly, it is standard practice to seal the pores 68 with a sealing layer 70 illustrated in the cross-sectional view of FIG. 8, which prevents the entry of the etching plasma into the pores 68. A conventional sealing layer 70 is composed of boehmite, which is (—AlO(OH), that is aluminum hydroxide. The boehmite sealing layer 70 may be formed by immersing the anodized surface in hot deionized water (DI).

A fluorine-based plasma etch presents particular problems for anodized aluminum chamber parts. A typical process gas for etching metal includes a fluorocarbon $C_xF_y$ although other gases may be added and other fluorine-based etching gases include $NF_3$, $SF_6$, and other fluorides. Dielectric etching processes similarly use plasmas of fluorocarbon gases. The fluorine in the presence of aluminum parts, even anodized parts, is likely to produce aluminum fluoride ($AlF_x$) and aluminum oxyfluoride (AlOF), which are non-volatile and deposit on the anodized part and begins to thicken. Although particles are a potential problem, a more immediate problem is that the thickening aluminum fluoride or oxyfluoride film tends to change the chemistry of the chamber and causes the etching process to drift. Unlike most other fluorides or halides, aluminum fluoride is a non-volatile and is a hard material insoluble in water and many solvents. No plasma cleaning process has been found that can remove the aluminum fluoride during an in situ plasma dry clean. A further problem is that the aluminum fluoride tends to be covered by a thin layer of glass silica ($SiO_2$), formed either from quartz chamber parts or as reaction by-products from etching a silicon or silicon oxide layer.

Conventional cleaning processes have used heavy abrasive scrubbing to remove the AlF and silica layer. However, the heavy scrubbing tends to damage the anodic coating. Sometimes dilute oxalic acid ($C_2H_2O_4$) is used as a wet cleaning solution. However, oxalic acid does not effectively remove the by-products and residue from the wafer processing. Further, the acid solution tends to degrade the anodization and the sealing layer.

It is possible to simply replace chamber parts with fresh and newly anodized parts. However, parts tend to be expensive and the aluminum vacuum chamber itself needs occasional cleaning.

SUMMARY OF THE INVENTION

A cleaning method for removing fluoride residues from an anodized aluminum surface or other metal oxide surface. The surface is exposed to a solvent which dissolves fluoride, for example, a fluoride acid such as ammonium fluoride. Preferably, the solvent dissolves the fluoride residues in water. The method is particularly useful for cleaning anodized aluminum parts exposed to a fluorine plasma in a plasma etch reactor.

The application of the wet solvent may be preceded by a wet abrasive scrubbing of the surface, preferably using a non-metal abrasive. The abrasive scrubbing is useful in removing a hard silica surface layer that tends to form.

After cleaning, the anodization may be resealed by submerging the part in a hot water bath, which may have the effect of filling pores of the anodization with boehmite.

DETAILED DESCRIPTION OF THE PREFERRED EMBODIMENTS

The invention provides a method for gently but effectively wet cleaning anodized chamber parts to remove aluminum fluoride and oxyfluoride deposits. Further, the invention may include resealing a cleaned anodized part.

For cleaning, the parts need to be disassembled from the chamber. Specialized parts may need special pre-processing. For example, some of the chamber liners may include internal cooling passages. These passages need to be drained, flushed, purged, and then possibly plugged to isolate them from the subsequent wet cleaning. A pre-rinsing step in deionized (DI) water may be used to clean extraneous particles.

Figure 1:
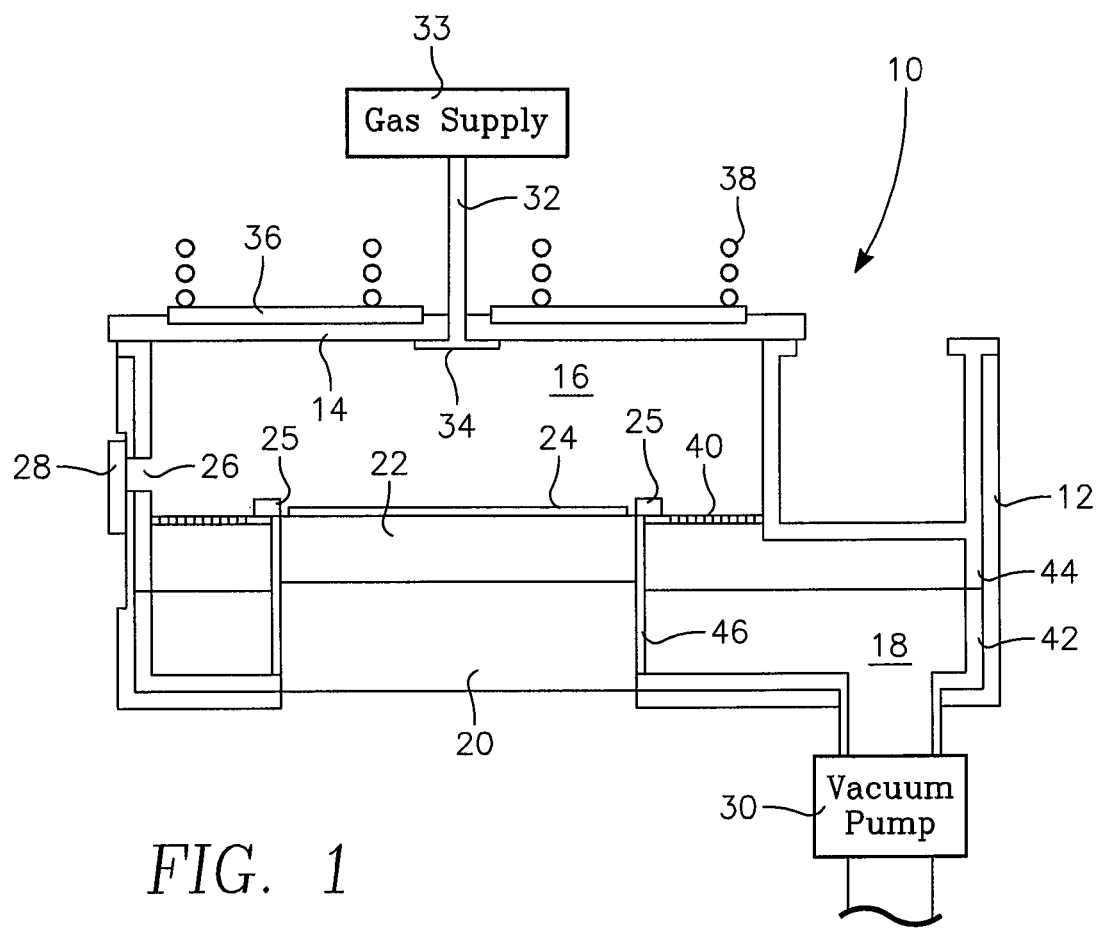
FIG. 1 is a schematic cross-sectional view of a plasma etch reactor with which the invention may be used.
Figure 2:
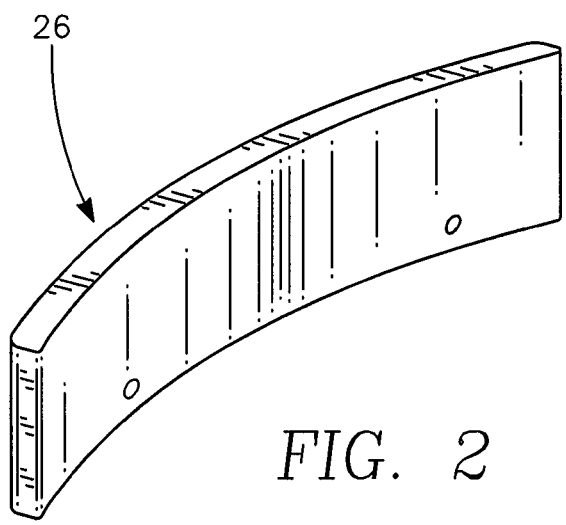
FIG. 2 is an orthographic view of a slit valve door of the reactor of FIG. 1.
Figure 3:
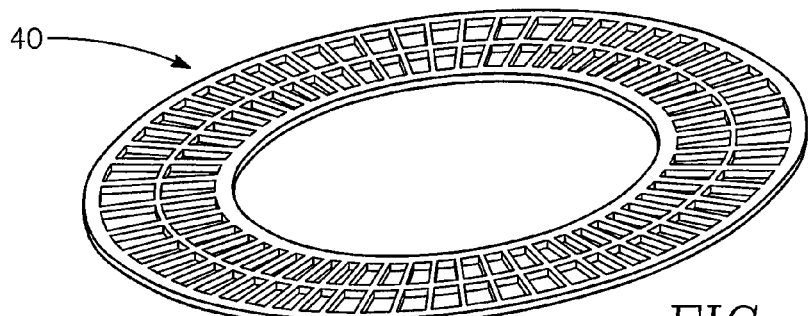
FIG. 3 is an orthographic view of a screen of the reactor of FIG. 1.
Figure 4:
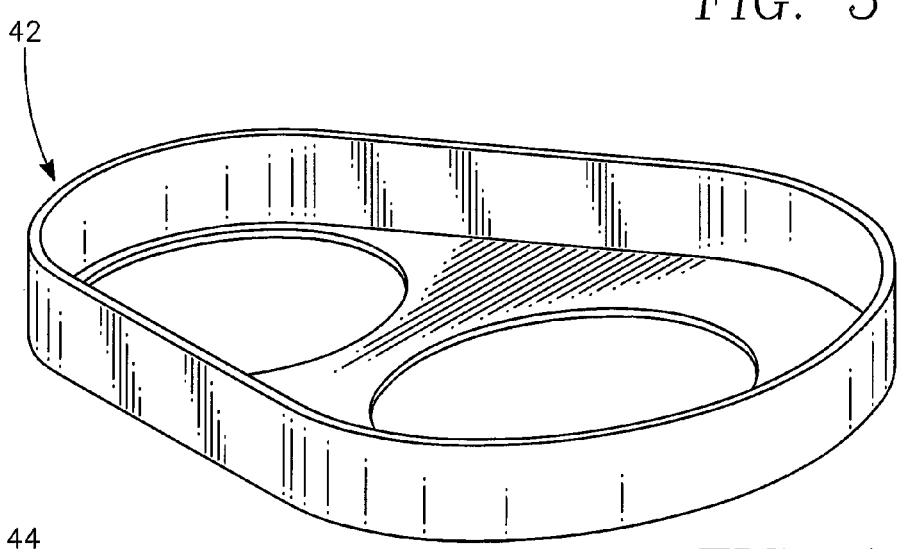
FIGS. 4 and 5 are orthographic views of a lower and an upper liner of the reactor of FIG. 1.
Figure 5:
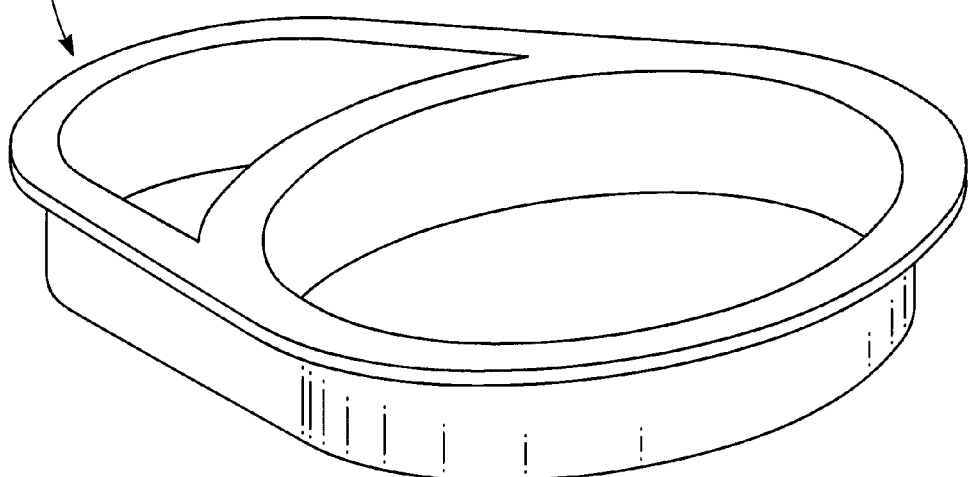
Figure 6:
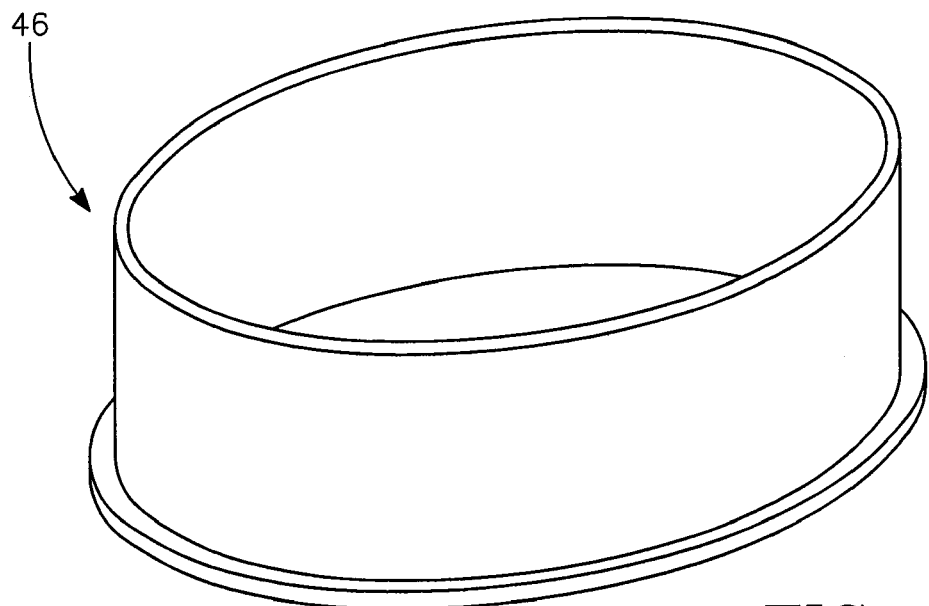
FIG. 6 is an orthographic view of a cathode liner of the reactor of FIG. 1.
Figure 7:
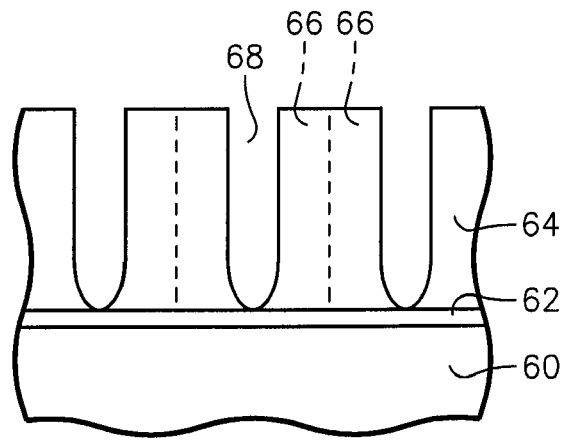
FIG. 7 is a cross-sectional view of an anodized aluminum surface.
Figure 8:
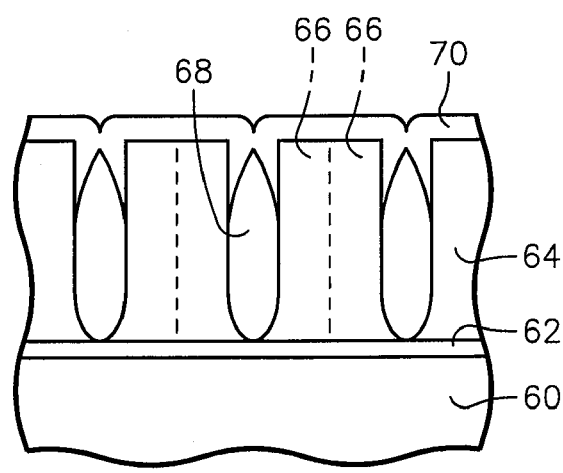
FIG. 8 is a cross-sectional view of a sealed anodized aluminum surface.
Figure 9:
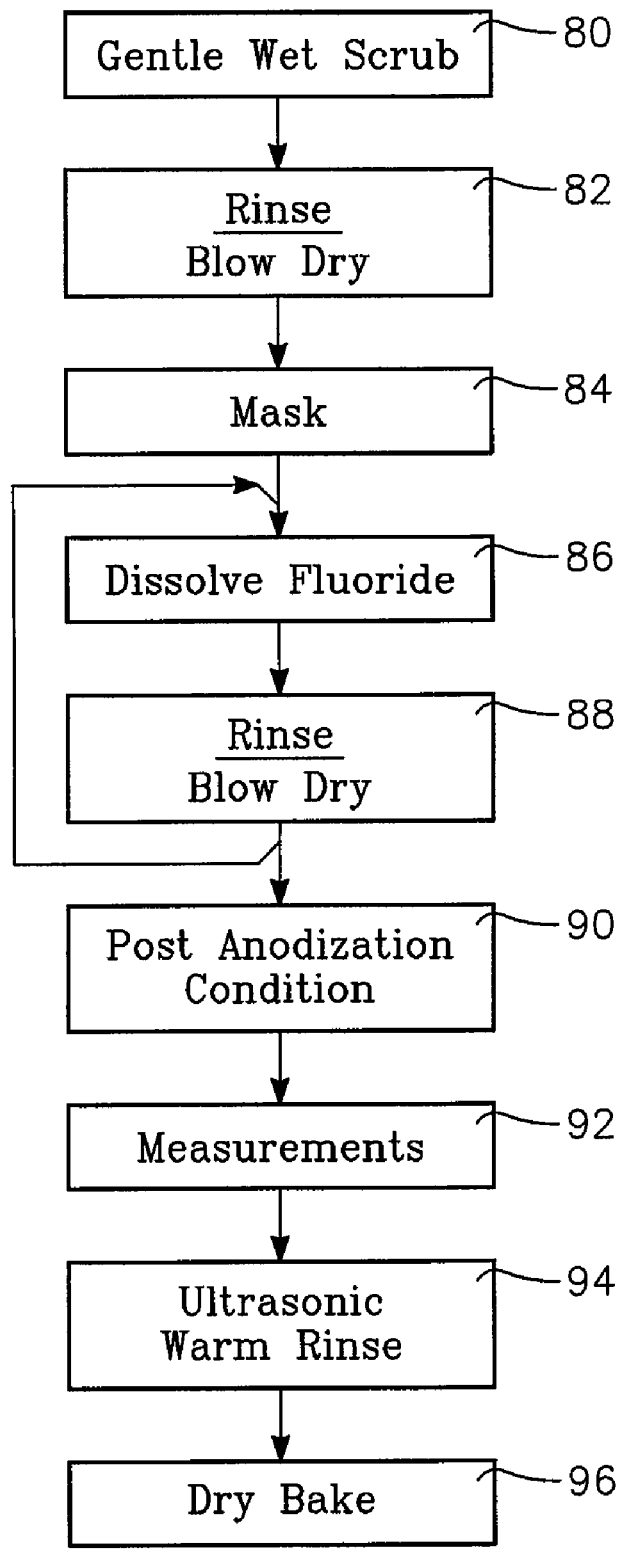
FIG. 9 is a flow diagram illustrating one embodiment of a method of practicing the invention.

The process for cleaning each part is summarized in the flow chart of FIG. 9. In step 80, manual cleaning removes deposits by gentle wet scrubbing. The scrubbing is effective at removing the glass silica coating which tends to form when the etch chamber contains quartz parts. The wet agent for suspending the silica particles may be DI water. The abrasive may be a gray Scotch-Brite™ abrasive pad or sponge available from the 3M Corporation of St. Paul, Minn. Gray Scotch-Brite abrasive is an ultra fine woven hard plastic abrasive containing ultra fine silicon carbide particles. In step 82, the scrubbed part is rinsed, for example, in DI water and blown dry, for example, with nitrogen or clean dry air.

In step 84, the part is masked to protect areas not needing cleaning, for example, unanodized surfaces or surfaces not subject to extraneous depositions.

In step 86, the part is subjected to a wet treatment that dissolves the fluoride. A preferred solvent is ACT NE-14, which is a buffered fluoride acid available from Ashland Speciality Chemical Company of Dublin, Ohio. The commercially available NE-14 may be used undiluted but optionally may be diluted. The principal active component of NE-14 is believed to be ammonium fluoride ($NH_4F$) in an aqueous solution. Ammonium fluoride may be also characterized as either a fluorinated salt or an ammonium-containing base. The buffering is accomplished with ammonium acetate. The residues $AlCl_3$, $AlF_3$ and $Al(OH)_3$ are not soluble in water, but ammonium fluoride converts them to $NH_4AlF_4$, which is very soluble in water. Unlike HF, the ammonium fluoride is not a strong enough to reduce $Al_2O_3$ or otherwise degrade the aluminum anodization and would also reform the fluoride as the undesired $AlF_x$. Similarly, the NE-14 does not effectively etch or attack oxide ceramics such as alumina ($Al_2O_3$) and yttria ($Y_2O_3$) or other ionically bonded metal oxides such as zirconium oxide.

To convert the aluminum fluoride, the part may be submersed in a continually agitated bath of NE-14 for an extended period, for example, greater than 10 minutes at room temperature or above. A sample recipe includes a 1 hour bath at 20° C. The effect of the solvent bath is to remove all fluorine from the anodized surface and to dissolve it in the solvent.

The fluorine-containing solvent is then removed from the anodized part in step 88. For example, the part is spray rinsed with DI water and then immersed in an ultrasonic bath rinse of DI water. It is then completely blown dry with either filtered nitrogen or clean dry air. It is preferred to repeat steps 86, 88, preferably once.

After the fluoride has been removed, in step 90, a post anodization conditioning may be optionally performed to reseal the pores. This conditioning may be the same as that performed after the initial anodization of the aluminum part even though in the illustrated sequence no anodization step occurs. An example of the conditioning or resealing step is a hot seal in hot DI water at a temperature preferably between 95° and 115° C. with continuous agitation, for several hours. One recipe includes four hours of immersion in agitated boiling (100° C.) DI water. However, other resealing conditions may be used, and higher temperature will reduce the processing time but at the risk of cracking the fragile anodization.

In step 92, two measurements may be made to test the effectiveness of the process. One type of test uses ion chromatography to determine the fluorine anion concentration on the surface of the part. Cleaned liners, the parts expected to have the highest contamination, were measured to have fluoride anion (F) concentrations of 0.92 and $3.2 \times 10^{14} cm^{-2}$. Other chamber parts such as the door and the cathode were measures to have somewhat lower levels of 0.9 to $1.3 \times 10^{14} \text{cm}^{-2}$. For comparison, similar tests were performed prior to cleaning and demonstrated fluoride anion concentrations on the surfaces of some of the liners of 45 and $110 \times 10^{14} \text{cm}^{-2}$. That is, the cleaning reduced the fluoride anion concentration by about a factor of 50 or more. For further comparison, a new anodized part was measured to have a fluoride anion concentration of $0.62 \times 10^{14} \text{cm}^{-2}$. That is, the cleaned part had no more than about twice the fluorine contamination as a part not used in fluorine-based plasma processing.

A second type of test measured the effectiveness of the resealing of the pores of the anodization. The seal value was measured in a wet process which exposed to surface of the anodized surface to an electrolyte and the electrical admittance (inverse of the impedance) was measured between the electrolyte and the aluminum substrate. If the pores are poorly sealed, the electrolyte leaks into the pores and the admittance is increased so that a high admittance or seal value indicates a poorly sealed anodization. The seal values were measured after cleaning and resealing to be no more than about 8000. In contrast, prior to cleaning and resealing, the seal values were about 24,000 on the cathode and no more than about 18,000 on the liners. That is, the cleaning and resealing not only did not degrade the sealing after use, they significantly increased it. If the part fails to pass a minimum threshold in either of these two tests, the cleaning process may be repeated or the part may be discarded and replaced by a fresh part.

During process development, the tests were performed in each cleaning cycle. Once, the process enters extended production, the frequency of the one or more tests may be reduced, for example, to only 20% of the time, to assure that the cleaning process is being satisfactorily performed.

Before the part reenters production, in step 94 it is subjected to a warm ultrasonic rinse, for example in DI water held in the range of 38 to 46° C. for 30 min. A broader temperature range includes any temperature greater than 35° C. This step effectively removes any salt, such as a fluoride compound, from the anodized part. The part is then blown dry.

Finally, in step 96, the cleaned part is subjected to a dry bake, for example, for at least 3 hours in an oven held at an elevated temperature preferably between 90° and 115° C., for example, 100° C. although baking temperatures as low as 80° are possible. The oven is purged during baking with filtered nitrogen or clean dry air. The baking removes any wet residue, for example, in incompletely sealed pores. Higher oven temperatures will allow shorter bake times.

It is possible to apply the method to larger, more complex parts, such as the chamber body, which is economically fabricated of anodized aluminum.

Although the invention has been developed for removing flouride residues from anodized aluminum parts without the need to reanodize them, it can be applied to cleaning surfaces of other materials, for example, ceramics formed of refractory metal oxides such as alumina, yttria, zirconia and other ionically bonded metal oxides. Particularly in the case of ceramics, there typically is no need to reseal the surface after cleaning. On the other hand, the part recovery of the invention is not immediately applicable to cleaning quartz ($SiO_2$), which is considered a covalently bonded oxide compound. NE-14 is known to attack both quartz and carbon-containing polymeric photoresist.

The invention thus provides an economical method for refurbishing chamber parts exposed to a plasma which tends to form insoluble residues on the parts, such as results from plasma etching using a fluorine-containing etching gas.

The invention claimed is:

1. A method for cleaning an anodized aluminum member, comprising the steps of:
    wet scrubbing an anodized surface of the aluminum member with a non-metallic abrasive; and
    then exposing the anodized surface with a liquid solvent comprising an aqueous solution of ammonium fluoride ($NH_4F$) and essentially no hydrofluoric acid, wherein the liquid solvent dissolves aluminum fluoride but leaves at least part of the anodized surface on the aluminum member.

2. The method of claim 1, further comprising a subsequent step of sealing pores of the anodized surface.

3. The method of claim 2, wherein the member is not reanodized between the exposing and sealing steps.

4. The method of claim 2, wherein the sealing step comprises bathing the anodized surface in water at a temperature of greater than 95° C.

5. The method of claim 4, wherein the bathing step continues for a plurality of hours.

6. The method of claim 2, further comprising the subsequent step of ultrasonically rinsing the anodized surface in water at a temperature greater than 35° C.

7. The method of claim 6, further comprising the subsequent step of baking the member in a dry ambient at a temperature of at least 80° C.

8. The method of claim 1, wherein the member was exposed to an etching plasma in a chamber containing a quartz part prior to the wet scrubbing step.

9. The method of claim 1, wherein the wet scrubbing is performed with deionized water.

10. The method of claim 1, wherein the liquid solvent includes an active component consisting of $NH_4F$ and includes no other active component.

11. A method for cleaning an oxide surface, comprising exposing an anodized surface of an aluminum member to a liquid solvent comprising an aqueous solution of ammonium fluoride and no effective amount of hydrofluoric acid, wherein the liquid solvent dissolves fluoride but leaves at least part of the anodized surface on the aluminum member.

12. The method of claim 11, wherein the anodized surface was exposed to an etching plasma in a chamber containing a quartz part prior to the wet scrubbing step.

13. The method of claim 11, wherein the wet scrubbing is performed with deionized water.

14. The method of claim 11, wherein the liquid solvent includes an active component consisting of $NH_4F$ and includes no other active component.

15. The method of claim 11, wherein the anodized surface has had its pores sealed and has then been exposed to an etching plasma prior to the step of exposing the anodized surface of the aluminum member to the liquid solvent.

16. The method of claim 11, further comprising the preceding step of wet scrubbing the anodized surface with a non-metallic abrasive.

* * * * *